(12) United States Patent
Biggs et al.

(10) Patent No.: US 9,972,511 B2
(45) Date of Patent: May 15, 2018

(54) SUBSTRATE PROCESSING APPARATUS AND METHODS

(71) Applicant: APPLIED MATERIALS, INC., Santa Clara, CA (US)

(72) Inventors: Brent Biggs, San Jose, CA (US); Takashi Kuratomi, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 125 days.

(21) Appl. No.: 14/986,146

(22) Filed: Dec. 31, 2015

(65) Prior Publication Data

US 2017/0098554 A1    Apr. 6, 2017

Related U.S. Application Data

(60) Provisional application No. 62/236,118, filed on Oct. 1, 2015.

(51) Int. Cl.
| | |
|---|---|
| *B08B 3/00* | (2006.01) |
| *H01L 21/67* | (2006.01) |
| *B08B 7/00* | (2006.01) |
| *H01J 37/32* | (2006.01) |
| *H01L 21/02* | (2006.01) |

(52) U.S. Cl.
CPC ...... *H01L 21/67028* (2013.01); *B08B 7/0035* (2013.01); *H01J 37/321* (2013.01); *H01J 37/32082* (2013.01); *H01J 37/32174* (2013.01); *H01J 37/32926* (2013.01); *H01L 21/02068* (2013.01); *H01J 2237/334* (2013.01); *H01J 2237/335* (2013.01)

(58) Field of Classification Search
None
See application file for complete search history.

(56) References Cited

U.S. PATENT DOCUMENTS

| 6,313,042 B1 | 11/2001 | Cohen et al. |
| 8,951,385 B2 | 2/2015 | Maeda et al. |
| 2005/0093460 A1 | 5/2005 | Kim et al. |

(Continued)

FOREIGN PATENT DOCUMENTS

JP    2003037101    2/2003

OTHER PUBLICATIONS

International Search Report and Written Opinion dated Dec. 9, 2016 for PCT Application No. PCT/US2016/051496.

*Primary Examiner* — Eric W Golightly
(74) *Attorney, Agent, or Firm* — Moser Taboada; Alan Taboada

(57) ABSTRACT

Apparatus and methods for processing substrates are disclosed. In some embodiments, a substrate processing system includes: a process chamber defining an interior volume for receiving a substrate and having a plasma forming zone, a substrate support positioned within the interior volume, a resonator coil disposed proximate the plasma forming zone, and a resonant inductor tuning circuit configured to vary an RF feed point location along the resonator coil. A method of operating a substrate processing system, according to embodiments, includes: transferring a substrate to a substrate support disposed within an interior volume of a processing chamber, the interior volume having a plasma forming zone, and operating a resonant inductor tuning circuit to couple an RF power source to a first RF feed point of a plurality of RF feed points along a resonator coil disposed proximate the plasma forming zone.

20 Claims, 2 Drawing Sheets

(56) References Cited

U.S. PATENT DOCUMENTS

2006/0228900 A1  10/2006  Dip et al.
2007/0181064 A1   8/2007  Fink
2010/0015357 A1   1/2010  Hanawa et al.

SUBSTRATE PROCESSING APPARATUS AND METHODS

REFERENCE TO RELATED APPLICATIONS

The present application claims the benefit of priority to U.S. Provisional Patent Application Ser. No. 62/236,118, filed on Oct. 1, 2015, and entitled "Substrate Processing Apparatus and Methods", which is herein incorporated by reference in its entirety.

FIELD

Embodiments of the present disclosure generally relate to substrate processing systems, and more specifically, to plasma enhanced substrate processing systems.

BACKGROUND

Conventional chemical vapor deposition (CVD), physical vapor deposition (PVD), and other techniques are used to deposit electrically conductive material into the contact holes, vias, trenches, or other patterns formed on a substrate. The presence of native or process generated oxides and other contaminants within a feature frequently can result in voids by promoting uneven distribution of the depositing metal. The residual oxides typically form as a result of exposing the exposed film layer/substrate to oxygen or as a byproduct of wafer processing. Oxygen exposure can occur, for example, when moving substrates between processing chambers at atmospheric conditions, or when a small amount of oxygen remaining in a vacuum chamber contacts a substrate/film layer, or when a layer is contaminated by etching, or oxygen exposure during mask removal. Other defects within the features formed on a substrate can be sputtered material from an oxide over-etch, residual photoresist from a stripping process, leftover hydrocarbon or fluorinated hydrocarbon polymers from a previous oxide etch process, or redeposited material from a preclean sputter etch process. The native oxide and other defects create regions on the substrate which increases contact resistance.

The presence of native or process generated oxides and other defects may increase the via/contact resistance. Although defects may be limited to a thin boundary region within the features, even a thin boundary region can form a substantial part of small feature(s). The acceptable level of defects in the features decreases as the features get smaller in width.

Substrate processing systems, such as plasma preclean chambers utilizing resonator inductor circuits, may be used to clean a substrate before or after other processes. However, the inventors have observed that current fixed position resonator inductor circuits can only be tuned to a single position for a given configuration.

Accordingly, the inventors have provided embodiments of an improved substrate processing system.

SUMMARY

Apparatus and methods for processing substrates are disclosed herein. In some embodiments, a substrate processing system includes: a process chamber defining an interior volume for receiving a substrate and having a plasma forming zone, a substrate support positioned within the interior volume, a resonator coil disposed proximate the plasma forming zone, and a resonant inductor tuning circuit configured to vary a length of the resonator coil.

In some embodiments, a substrate processing system includes: a process chamber defining an interior volume for receiving a substrate and having a plasma forming zone; a substrate support positioned within the interior volume; a resonator coil disposed proximate the plasma forming zone; and a resonant inductor tuning circuit configured to alter a length of the resonator coil.

In other embodiments, a method of operating a substrate processing system includes: transferring a substrate to a substrate support disposed within an interior volume of a processing chamber, the interior volume having a plasma forming zone; and operating a resonant inductor tuning circuit to select a first RF feed point, of a plurality of RF feed points along a resonator coil disposed proximate the plasma forming zone. In some embodiments, the method further comprises operating the resonant inductor tuning circuit to select a second RF feed point along the resonator coil.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
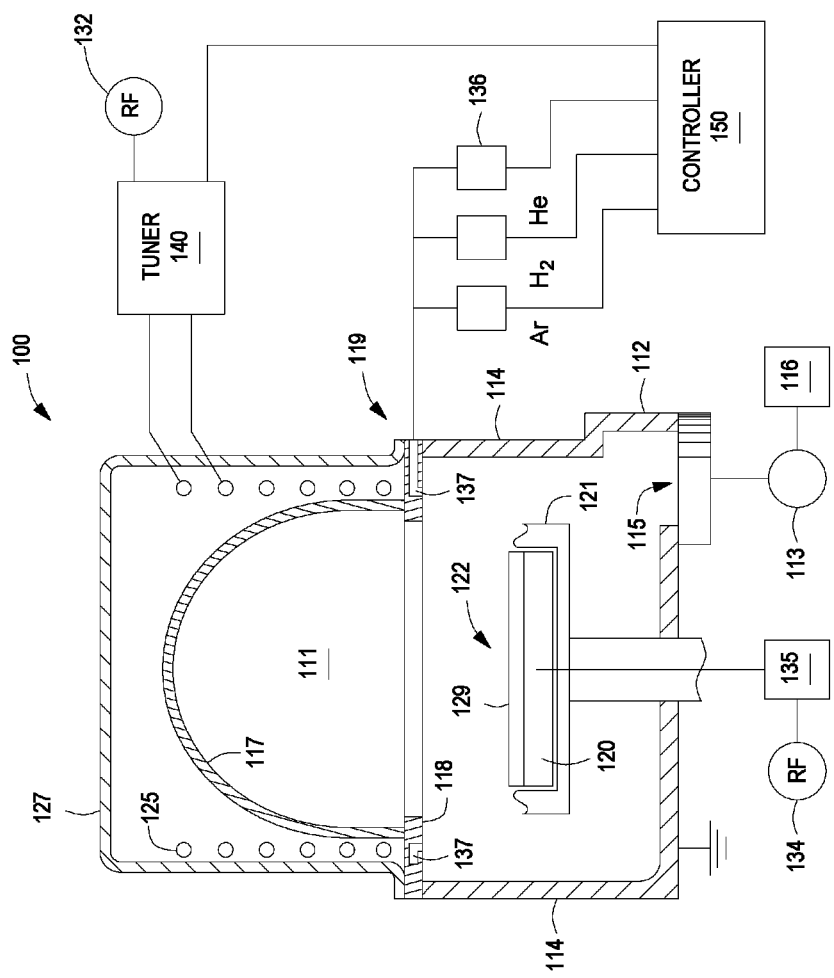
FIG. 1 depicts a schematic view of a substrate processing system utilizing a resonant inductor tuning circuit in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Apparatus for processing substrate are disclosed herein. Embodiments of the inventive apparatus may dynamically adapt to two discordant gases in a plasma used to clean a substrate disposed in the apparatus. For example, two gas treatments may advantageously be used to remove native or process generated oxides and other defects, such as etch residues, oxides, or the like, without damaging the inter-level dielectric (ILD) substrate. Embodiments of the inventive apparatus may be utilized to clean suitable substrates having defects, for example, such as a substrate having a low contact resistance material that has been exposed beneath the ILD during mask/dielectric etch processing. For example, a substrate may be cleaned in the inventive apparatus to remove etch residues, native or process generated oxides and other defects or the like to expose a metal surfaces during middle end of line (MEOL) processing to form the metal interconnect structures.

FIG. 1 depicts a schematic view of a substrate processing system (e.g. system 100) utilizing a vacuum processing chamber (e.g., chamber 111) and a resonant inductor tuning circuit 140 in accordance with some embodiments of the present disclosure. The processing chamber can be a Preclean XT chamber which is available from Applied Materials, Santa Clara, Calif. In an embodiment, chamber 111 is formed by a base member 112 having sidewalls 114 and which may be made of metallic construction such as stainless steel, aluminum or the like. An opening 115 in the base member 112 is connected to a servo control throttle valve 113 and a turbo pump 116 which is used to control the gas pressure inside the chamber 111. The servo control throttle valve 113 is automated to allow servo control to a specific pressure.

In embodiments, a dielectric dome 117 comprised, for example, of quartz, forms the top of the chamber 111 and is provided with a flange 118 about the circumference where the dielectric dome 117 mates with the top circumference of the sidewalls 114 of base member 112. In an embodiment, a gas distribution system 119 is provided at the juncture of dielectric dome 117 and one of sidewalls 114. An upper surface of a metallic sidewall member 114 has a gas supply trench 137 milled therein and from six to twelve evenly spaced (angularly) disposed channels (inlets) not shown extending from one or more gas sources intersect the trench to form a plurality of gas injection holes (not shown).

In some embodiments, the gas distribution system 119 may supply Ar, He, and $H_2$ gases which are typically metered by mass flow controllers 136. Pure hydrogen may also be supplied though a gas containment box for safe delivery of the hydrogen. A substrate support 122 is positioned within the interior volume of chamber 111 and arranged to hold a substrate (not shown). In an embodiment, the substrate support 122 has a quartz body 121 surrounding the sides and bottom of a conductive portion 120. An insulating layer 129 may be placed between the conductive portion 120 of the substrate support 122 and any substrate transferred to the substrate support.

RF power from an RF power source 134 may be applied capacitively to the conductive portion 120 of the substrate support 122. A RF match box 135 adjusts the chamber impedance to optimize power transfer between the RF power source 134 and the substrate support 122. Typical RF frequencies are from about 2 MHz to about 60 MHz at power levels from about 10 W to about 1000 W.

Additional power is inductively supplied to the plasma by energizing resonator coil 125 wound helically exterior to the dielectric dome 117 so as to surround a plasma generating zone within the interior volume of chamber 111 and be supported by cover 127. An alternating axial electromagnetic field is produced in the interior volume of the chamber 111 interior to the winding of the resonator coil 125. Generally, an RF frequency between 200 KHz and 16 MHz is employed. A 2 MHz frequency is common. In an embodiment, an RF power source 132 operating at such a frequency is coupled to the resonator coil 125 at one of a plurality of selectable RF feed points (feed point locations) as feed points FP1 and FP2 via resonant inductor tuning circuit 140. In alternate embodiments, the RF feed point location may remain the same while the location at which the resonator coil 125 is grounded may be changed. Whether by change of RF feed point location or by change of ground point location, the effective length of the resonator coil 125 may be readily and easily modified to achieve conditions suited for a different process gas and/or pressure regime than those for which a previous RF feed point or ground point was suited.

Figure 2:
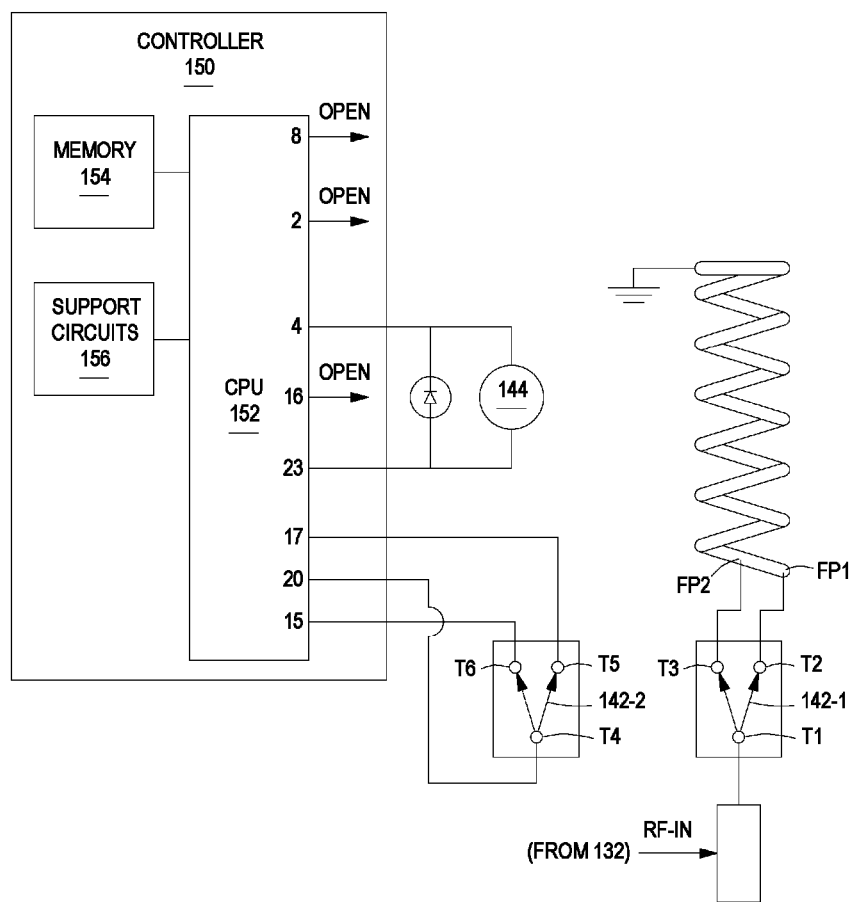
FIG. 2 depicts a control circuit schematic for implementing an alteration in RF feed point in accordance with embodiments of the present disclosure.

FIG. 2 depicts a control circuit schematic for implementing an alteration of resonant coil length (e.g., via a change in RF feed point) in accordance with embodiments of the present disclosure. In the embodiment of FIG. 2, a first RF feed point FP1 is disposed at a first location along resonator coil 125. Conventional fixed position resonant circuits manually tuned to a single RF feed point location (such as feed point FP1) selected for a particular set of substrate processing conditions which may include, for example, the plasma gas constituent(s), the pressure to be maintained within chamber 111, and the frequency of the RF power source 132. The inventors herein have observed that the manual tuning precludes the use of multiple gas (or gas mixture) combinations and/or chamber pressurizations. According to some embodiments of the present disclosure, multiple such combinations are made possible by varying the location of the RF feed point from a first RF feed point location, as for example FP1, to a second RF feed point location. In an embodiment, the selection of a new feed point is implemented by a software controlled relay, which may be a double-pole, double throw vacuum relay (e.g., relay 144 in FIG. 2).

As seen in FIG. 2, a resonant inductor tuning circuit 140 according to one or more embodiments includes a double pole double throw vacuum relay (relay 144) having at least two normally closed contacts and two normally open contacts. For sake of clarity, these contacts are represented as a pair of double pole, double throw switches indicated generally at 142-1 and 142-2, respectively. Switch 142-1 is connected to RF power source 132 by a common terminal T1, while terminal T2 is coupled to RF feed point location FP1. In the embodiment of FIG. 2, de-energization of the relay 144 causes the state of switch 142-1 to change state such that power received from RF power source 132 is no longer supplied to RF feed point location FP1 via terminal T2. Instead, an electrical connection is made between common terminal T1 and terminal T3. Terminal T3 is electrically coupled to RF feed point FP2.

In alternate embodiments, a single RF feed point is utilized and the switch 142-1 of relay 144 is instead used toggle between a first ground point (not shown) along resonator coil 125 and a second ground point disposed along resonator coil 125. Such an arrangement may be used to effectively lengthen or shorten the resonator coil 125 and accommodate a change in processing regime as contemplated by the inventors herein.

Wth continued reference to FIG. 2, the controller 150 comprises at least one processor such, for example, as central processing unit (CPU) 152, a memory 154, and support circuits 156 for the CPU 152. Controller 150 facilitates control of the components of the system 100 and, as such, methods of processing a substrate in the system 100. In some embodiments, memory 154 contains instructions executable by the at least one processor to control operation of the resonant inductor tuning circuit 140. In an embodiment, relay 144 is controlled by, execution of the instructions residing in memory 154, to open switch 142-1, causing the first contact made between terminals T1 and T2 to be made open and causing the second contact between terminals T1 and T3 to be made closed.

In some embodiments, switches 142-1 and 142-2 close in unison when the relay 144 is energized and the switches open in unison when the relay 144 is de-energized. Such synchronized opening and closing of switches 142-1 and 142-2 may be advantageously utilized by controller 150 to confirm the operating state of the former. That is, when switch 142-1 is connected across terminals T1 and T2 as shown in FIG. 2, switch 142-2 is likewise connected across terminals T4 and T5. Conversely, when switch 142-1 is connected across terminals T1 and T3, switch 142-2 is likewise connected across terminals T4 and T6. By appropriate connections of terminals T5 and T6 to controller 150, the controller 150 can verify the state of the resonant inductor tuning circuit 140 (FIG. 1) as a pre-condition to altering any processing parameters such as gas mixture and/or chamber pressurization.

In some embodiments, instructions stored in memory 154 and executable by CPU 152 cause current to stop flowing across pins 4 and 23 of CPU 152, which causes relay 144 to de-energize and switch 142-1 to open a normally closed connection (e.g., the first contact) between the RF power source 132 and RF feed point FP1 and to close a normally open connection (e.g., the second contact) between the RF power source 132 and RF feed point FP2.

In other embodiments, instructions stored in memory 154 and executable by CPU 152 cause current to start flowing across pins 4 and 23 of CPU 152, which causes relay 144 to energize and switch 142-1 to open a normally closed connection (e.g., the first contact) between the RF power source 132 and RF feed point FP1 and to close a normally open connection (e.g., the second contact) between the RF power source 132 and RF feed point FP2.

The controller 150 may be one of any form of general-purpose computer processor that can be used in an industrial setting for controlling various chambers and sub-processors. The memory, or computer-readable medium, 154 of the CPU 152 may be one or more of readily available memory such as random access memory (RAM), read only memory (ROM), floppy disk, hard disk, or any other form of digital storage, local or remote. The support circuits 156 are coupled to the CPU 152 for supporting the processor in a conventional manner. These circuits include cache, power supplies, clock circuits, input/output circuitry and subsystems, and the like. The memory 154 stores software (source or object code) that may be executed or invoked to control the operation of the system 100 in the manner described herein. The software routine may also be stored and/or executed by a second CPU (not shown) that is remotely located from the hardware being controlled by the CPU 152.

In embodiments, CPU 152, input asserted or de-asserted at pins 15 and 17, respectively via connections to terminals T6 and T5, respectively, are processed by instructions residing in memory 154 and executable by CPU 152 to determine if a change in RF feed point instructed by CPU 152 to relay 144 has been implemented. In some embodiments, instructions stored in memory 154 and executed by CPU 152 are further operative to alter one or more process conditions after an RF feed point change has been implemented and verified. For example, in an embodiment, instructions stored in the memory 154 are further executable by the at least one processor (e.g., CPU 152) to initiate at least one of alteration of a gas mixture already present in the plasma forming zone, introduction of a new gas or gas mixture not already present in the plasma forming zone, or modifying pressurization within the interior volume.

In an example of operation, a substrate is positioned on the substrate support 122, and the system 100 is evacuated to provide a vacuum processing environment. A processing gas is introduced through the gas inlet(s) entering chamber 111 via the gas supply trench 137. To activate the reaction, a plasma of the processing gas is generated in the processing region through inductive coupling and/or capacitive coupling. The initial plasma may be generated by applying power to the resonator coil 125 via feed point FP1 and through the capacitive coupling. During the reduction reaction period, the resonator coil 125 may be biased between about 0.0032 W/cm$^2$ and about 3.2 W/cm$^2$ at between about 100 KHz and about 60 MHz to sustain a plasma in the processing region inductively while the substrate support 122 is biased between about 0 W/cm$^2$ and about 0.32 W/cm$^2$ to sustain the plasma capacitively. Alternatively, during the reduction reaction period, the plasma in the processing region may be sustained solely by the resonator coil 125. The plasma within the processing region may be excited and sustained during processing by inductive coupling only, capacitive coupling only or combinations of both inductive and capacitive coupling. Alternatively, the initial plasma may be struck by biasing the substrate support 122 between about 0.0032 W/cm$^2$ and about 0.32 W/cm$^2$, which corresponds to a RF power level between about 1 W and about 100 W for a 200 mm substrate, and between about 100 KHz and about 100 MHz for about 3 seconds.

The chamber pressure may initially be built up to the processing pressure by setting the servo control throttle valve 113 to a partially closed state. During processing, the chamber pressure may be maintained between about 1 mTorr and about 100 mTorr by controlling the open/closed state of the servo control throttle valve 113. Optionally, the temperature of the substrate during processing is controlled by a heater within the substrate support 122.

According to some embodiments, the initial processing described above is followed by a different gas mixture and/or a different pressure regime. Control 150 instructs relay 144 to open the normally closed contact of switch 142-1 and to close the normally open contact of switch 142-1. In so doing, the RF feed point changes from FP1 to FP2. As an illustrative example, the initial plasma formed within chamber 111 during a first substrate process is a gas mixture of argon gas, helium gas, and hydrogen gas maintained at a first pressure $P_1$, performed while RF power is fed at RF feed point FP1. During a second substrate process, a plasma formed from a gas mixture of argon gas, helium gas, and hydrogen gas is formed in the chamber 111, while RF power is fed at feed point FP2 and pressure in chamber 111 is maintained at a second pressure $P_2$. Thereafter, the substrate may be transferred from the processing chamber.

A method of operating a substrate processing system according to some embodiments of the disclosure includes transferring a substrate to a substrate support disposed within an interior volume of a processing chamber, the interior volume having a plasma forming zone, and operating a resonant inductor tuning circuit to couple an RF power source to a first RF feed point of a plurality of RF feed points along a resonator coil disposed proximate the plasma forming zone. In some embodiments, a plasma is formed of a first gas or of a first mixture of gases in the processing chamber while the resonant inductor tuning circuit is operated to couple RF power to the first RF feed point In some embodiments, the resonant inductor tuning circuit is further operated to couple the RF power source to a second RF feed point along the resonator coil, and a plasma of a second gas or second mixture of gases replaces the first gas or first mixture of gases in the processing chamber.

In embodiment, a method of pre-cleaning a substrate comprises transferring a substrate to a substrate support disposed within an interior volume of a processing chamber, the interior volume having a plasma forming zone, generating a first plasma within the processing chamber by operating a resonant inductor tuning circuit to couple an RF power source to a first RF feed point of a plurality of RF feed points along an inductor coil, and without removing the substrate from the plasma forming zone, generating a second plasma by operating the resonant inductor tuning circuit to couple the RF power source to a second RF feed point of the plurality of RF feed points. By modifying the location of the RF feed point, the substrate can be exposed to plasma generated from different gases and/or gas mixtures as part of a single processing (e.g., cleaning) recipe—without, for example, the need to transfer the substrate to a different chamber or to wait for a manual re-tuning of the RF power source (i.e., to adjust to the characteristics of a second processing gas or gas mixture).

Thus, an improved apparatus for processing substrates has been provided herein. Embodiments of the inventive apparatus may advantageously two gas treatments in a plasma used to clean a substrate disposed in the apparatus with reduced native or process generated oxides and other defects to surfaces of the substrate or to materials disposed thereon. While the foregoing is directed to embodiments of the present disclosure, other and further embodiments of the disclosure may be devised without departing from the scope thereof.

The invention claimed is:

1. A substrate processing system, comprising:
   a process chamber defining an interior volume for receiving a substrate and having a plasma forming zone;
   a substrate support positioned within the interior volume;
   a resonator coil disposed proximate the plasma forming zone; and
   a resonant inductor tuning circuit configured to alter a length of the resonator coil in response to substrate processing conditions.

2. The substrate processing system of claim 1, further comprising an RF power source, wherein the resonant inductor tuning circuit comprises a relay having:
   a first contact operative to electrically couple the RF power source to a first RF feed point location along the resonator coil, and
   a second contact operative to electrically couple the RF power source to a second RF feed point location along the resonator coil.

3. The substrate processing system of claim 2, wherein the first contact is a normally closed contact, and the second contact is a normally open contact.

4. The substrate processing system of claim 3, further comprising a controller having at least one processor and a memory containing instructions executable by the at least one processor to cause the relay to open the first contact and close the second contact.

5. The substrate processing system of claim 2, further comprising a controller having at least one processor and a memory containing instructions executable by the at least one processor to energize the relay.

6. The substrate processing system of claim 2, further comprising a controller having at least one processor and a memory containing instructions executable by the at least one processor to de-energize the relay.

7. The substrate processing system of claim 1, further comprising a controller having at least one processor and a memory containing instructions executable by the at least one processor to control operation of the resonant inductor tuning circuit based on a frequency of a Radio Frequency power source, a process chamber pressure, or a gas used in a substrate process.

8. The substrate processing system of claim 7, wherein instructions stored in the memory are further executable by the at least one processor, after receipt of feedback from the resonant inductor tuning circuit, to initiate at least one of:
   alteration of a gas mixture already present in the plasma forming zone,
   introduction of a new gas or gas mixture not already present in the plasma forming zone, or
   modifying pressurization within the interior volume.

9. A method of operating a substrate processing system, comprising:
   transferring a substrate to a substrate support disposed within an interior volume of a processing chamber, the interior volume having a plasma forming zone; and
   operating a resonant inductor tuning circuit to couple an RF power source to a first RF feed point of a plurality of RF feed points along a resonator coil disposed proximate the plasma forming zone such that a length of the resonator coil is altered in response to substrate processing conditions.

10. The method of claim 9, further comprising forming a plasma of a first gas or of a first mixture of gases in the processing chamber.

11. The method of claim 10, further comprising operating the resonant inductor tuning circuit to couple the RF power source to a second RF feed point of the plurality of RF feed points along the resonator coil.

12. The method of claim 11, further comprising forming a plasma of a second gas or of a second mixture of gases in the processing chamber.

13. The method of claim 11, further including exposing at least a first portion of the substrate to plasma formed from the first gas or first mixture of gases.

14. The method of claim 13, wherein exposing the first portion is performed for a duration and under conditions of pressure and temperature effective to remove at least one of native oxides, process generated oxides, or etch residues from the first portion.

15. The method of claim 14, further including exposing at least one of the first portion or a second portion of the substrate to plasma formed from a second gas or a second mixture of gases.

16. The method of claim 15, wherein exposing at least one of the first portion or second portion to plasma is performed for a duration and under conditions of pressure and temperature effective to remove at least one of native oxides, process generated oxides, or etch residues.

17. A method of operating a substrate processing system to preclean a substrate, comprising:
   transferring a substrate to a substrate support disposed within an interior volume of a processing chamber, the interior volume having a plasma forming zone;
   generating a first plasma within the processing chamber by operating a resonant inductor tuning circuit to couple an RF power source to a first RF feed point of a plurality of RF feed points along a resonator coil disposed proximate the plasma forming zone; and
   without removing the substrate from the plasma forming zone, generating a second plasma by operating the resonant inductor tuning circuit to couple the RF power source to a second RF feed point of the plurality of RF feed points such that a length of the resonator coil is altered in response to substrate processing conditions.

18. The system of claim 1, wherein the resonant inductor tuning circuit changes a ground point location of the resonator coil to alter the length of the resonator coil.

19. The system of claim 1, wherein the resonant inductor tuning circuit changes an RF feed point location of the resonator coil to alter the length of the resonator coil.

20. The system of claim 1, wherein the resonant inductor tuning circuit provides feedback when the length of the resonator coil is altered.

* * * * *